(12) United States Patent
Swaminathan et al.

(10) Patent No.: US 11,889,046 B2
(45) Date of Patent: Jan. 30, 2024

(54) COMPACT, LOW COST VCSEL PROJECTOR FOR HIGH PERFORMANCE STEREODEPTH CAMERA

(71) Applicant: INTEL CORPORATION, Santa Clara, CA (US)

(72) Inventors: Krishna Swaminathan, Santa Clara, CA (US); Anders Grunnet-Jepsen, San Jose, CA (US); Leonid M. Keselman, Santa Clara, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/176,000

(22) Filed: Feb. 15, 2021

(65) Prior Publication Data
US 2021/0185190 A1 Jun. 17, 2021

Related U.S. Application Data

(63) Continuation of application No. 15/193,956, filed on Jun. 27, 2016, now Pat. No. 10,924,638.

(51) Int. Cl.
*H04N 13/239* (2018.01)
*H04N 13/257* (2018.01)
(Continued)

(52) U.S. Cl.
CPC ........... *H04N 13/239* (2018.05); *F21V 5/007* (2013.01); *F21V 5/008* (2013.01);
(Continued)

(58) Field of Classification Search
CPC ..... F21V 5/007; F21V 5/008; G01B 11/2513; G01C 3/08; G01S 3/00; G02B 3/0056;
(Continued)

(56) References Cited

U.S. PATENT DOCUMENTS 5,835,517 A * 11/1998 Jayaraman ........... G02B 6/2938
372/101
9,443,310 B2 9/2016 Hudman et al.
(Continued)

FOREIGN PATENT DOCUMENTS

EP 2916149 A1 * 9/2015 ......... G02B 27/0961
KR 1020130037152 4/2013
(Continued)

OTHER PUBLICATIONS

International Searching Authority, "International Search Report and Written Opinion." Issued in connection with PCT Application No. PCT/US2017/032943, dated Aug. 29, 2017, 13 pages.
(Continued)

*Primary Examiner* — Anner N Holder
(74) *Attorney, Agent, or Firm* — Hanley, Flight & Zimmerman, LLC

(57) ABSTRACT

A compact, low cost vcsel projector for high performance stereodepth camera is disclosed. An example apparatus includes an array of vertical cavity surface emitting lasers (VCSELs); an array of micro-lenses coupled to the array of VCSELs, centerlines of ones of the micro-lenses offset relative to centerlines of respective ones of the VCSELs; and a projection lens coupled to the array of micro-lenses.

21 Claims, 8 Drawing Sheets

(51) Int. Cl.

| | | |
|---|---|---|
| *G01S 3/00* | (2006.01) | |
| *G01B 11/25* | (2006.01) | |
| *G06F 3/04883* | (2022.01) | |
| *G06F 3/01* | (2006.01) | |
| *H01S 5/42* | (2006.01) | |
| *G06F 3/03* | (2006.01) | |
| *H01S 5/00* | (2006.01) | |
| *G06F 3/0354* | (2013.01) | |
| *G01C 3/08* | (2006.01) | |
| *H04N 23/81* | (2023.01) | |
| *F21V 5/00* | (2018.01) | |
| *G02B 3/00* | (2006.01) | |
| *H04N 5/33* | (2023.01) | |
| *H01S 5/02255* | (2021.01) | |

(52) U.S. Cl.
CPC ............ *G01B 11/2513* (2013.01); *G01C 3/08* (2013.01); *G01S 3/00* (2013.01); *G02B 3/0056* (2013.01); *G06F 3/011* (2013.01); *G06F 3/012* (2013.01); *G06F 3/017* (2013.01); *G06F 3/0304* (2013.01); *G06F 3/03547* (2013.01); *G06F 3/04883* (2013.01); *H01S 5/005* (2013.01); *H01S 5/423* (2013.01); *H01S 5/426* (2013.01); *H04N 5/33* (2013.01); *H04N 13/257* (2018.05); *H04N 23/81* (2023.01); *H01S 5/02255* (2021.01)

(58) Field of Classification Search
CPC .......... G06F 3/011; G06F 3/012; G06F 3/017; G06F 3/0304; G06F 3/03547; G06F 3/04883; H01S 5/005; H01S 5/02255; H01S 5/423; H01S 5/426; H04N 13/239; H04N 13/257; H04N 5/217; H04N 5/33
See application file for complete search history.

(56) References Cited

U.S. PATENT DOCUMENTS

| | | | |
|---|---|---|---|
| 10,924,638 | B2 | 2/2021 | Swaminathan et al. |
| 2002/0043561 | A1* | 4/2002 | Tsikos .................. G07G 1/0054 257/E29.144 |
| 2003/0011888 | A1* | 1/2003 | Cox .................. H01L 31/02325 257/E31.128 |
| 2004/0218875 | A1* | 11/2004 | Lemoff ................ G02B 6/4206 385/89 |
| 2005/0052751 | A1* | 3/2005 | Liu ...................... G02B 6/4249 257/E31.128 |
| 2007/0030570 | A1 | 2/2007 | Jacobowitz et al. |
| 2008/0187013 | A1 | 8/2008 | Guenter et al. |
| 2010/0046953 | A1* | 2/2010 | Shaw ...................... H01S 5/423 398/115 |
| 2010/0118123 | A1 | 5/2010 | Freedman et al. |
| 2011/0243178 | A1 | 10/2011 | Kolb et al. |
| 2012/0051588 | A1* | 3/2012 | McEldowney ........ G03B 21/14 348/46 |
| 2013/0266326 | A1* | 10/2013 | Joseph .................. H01S 5/4012 398/130 |
| 2014/0158862 | A1 | 6/2014 | Hsu |
| 2014/0176958 | A1 | 6/2014 | Flanders et al. |
| 2014/0211215 | A1 | 7/2014 | Pesach et al. |
| 2014/0240464 | A1 | 8/2014 | Lee |
| 2014/0375775 | A1 | 12/2014 | Yeatman, Jr. et al. |
| 2015/0097947 | A1* | 4/2015 | Hudman .................. G06T 7/521 348/136 |
| 2015/0292709 | A1 | 10/2015 | Petronius et al. |
| 2015/0340841 | A1* | 11/2015 | Joseph ................ H01S 5/04257 372/50.12 |
| 2016/0072256 | A1 | 3/2016 | Sorin et al. |
| 2016/0109575 | A1 | 4/2016 | Oggier et al. |
| 2016/0131318 | A1 | 5/2016 | Kim |
| 2016/0197452 | A1 | 7/2016 | Mor |
| 2017/0188012 | A1 | 6/2017 | Takagi |
| 2017/0307736 | A1* | 10/2017 | Donovan ................ G01S 7/499 |
| 2018/0006431 | A1 | 1/2018 | Winer et al. |
| 2018/0131450 | A1 | 5/2018 | Kare et al. |
| 2018/0197842 | A1 | 7/2018 | Tokunari |
| 2018/0225866 | A1* | 8/2018 | Zhang ..................... G06T 7/593 |
| 2019/0107604 | A1 | 4/2019 | Koers et al. |
| 2019/0249984 | A1 | 8/2019 | Barlev et al. |

FOREIGN PATENT DOCUMENTS

| | | | |
|---|---|---|---|
| WO | WO-2007082781 A1 * | 7/2007 | .......... G02B 3/0031 |
| WO | 2013127974 | 9/2013 | |

OTHER PUBLICATIONS

United States Patent and Trademark Office, "Non-Final Office Action," issued in connection with U.S. Appl. No. 15/193,956, dated Sep. 5, 2019, 12 pages.

United States Patent and Trademark Office, "Non-Final Office Action," issued in connection with U.S. Appl. No. 15/193,956, dated Mar. 27, 2020, 17 pages.

United States Patent and Trademark Office, "Final Office Action," issued in connection with U.S. Appl. No. 15/193,956, dated Jan. 3, 2020, 15 pages.

United States Patent and Trademark Office, "Notice of Allowance and Fee(s) Due.," issued in connection with U.S. Appl. No. 15/193,956, dated Sep. 25, 2020, 7 pages.

German Patent Office, "Office Action," issued in connection with German patent application No. 112017003205.9, dated Feb. 3, 2022, 10 pages. (English Translation Included).

International Searching Authority, "International Preliminary Report on Patentability," Issued in connection with PCT Application No. PCT/US2017/032943, dated Jan. 1, 2019, 8 pages.

* cited by examiner

Project a sequence of light patterns on an object using a projector, wherein the projector comprises a vertical cavity surface emitting laser (VCSEL) array comprising a plurality of VCSELs, a micro-lens array coupled to the VCSEL array and having a plurality of lenses, and each of the plurality of lenses is positioned over a VCSEL in the VCSEL array, and a projection lens coupled to the micro-lens array (MLA), wherein light emitted by the VCSEL array is projected as a sequence of patterns onto an object by the projection lens
601

Capture, using a camera, a sequence of images of the sequence of light patterns
602

Generate depth information via triangulation using the sequence of images
603

COMPACT, LOW COST VCSEL PROJECTOR FOR HIGH PERFORMANCE STEREODEPTH CAMERA

RELATED APPLICATIONS

This patent arises from a continuation of U.S. patent application Ser. No. 15/193,956 (now U.S. Pat. No. 10,924, 638), which was filed on Jun. 27, 2016, and which is incorporated herein by reference in its entirety. Priority to U.S. patent application Ser. No. 15/193,956 is claimed.

FIELD OF THE INVENTION

Embodiments of the present invention related to camera systems; more particularly, embodiments of the present invention relate to systems with VCSEL camera systems that use lenses to bend light.

BACKGROUND

Stereo depth cameras are well-known and are often used to measure a distance from an object. One such measurement device includes a projector and a camera. In such a device, the projector projects a known pattern image on an object (e.g., a scene), and an image of the object upon which the image is projected is captured by the camera. From the captured images, depth information may be determined. One technique for determining depth in such devices is through the use of triangulation. Thus, images of objects are captured and measurements are taken to determine depth information.

It is well known that use of an infra-red (IR) laser projector to project a textured pattern onto the target provides a significant boost to the performance of stereoscopic depth cameras. The projected pattern adds texture to the scene and allows high accuracy depth imaging of even targets with minimal or no texture such as a wall. In the case of stereo cameras using structured light approach, the knowledge of the size and distance between the features in the projected pattern is even more important and acts as the main mechanism to achieve accurate depth maps. Due to these reasons, an IR laser pattern projector has been widely used in almost all stereoscopic depth cameras.

Most laser projectors currently being used have a typical design that includes an IR edge emitting laser, an optical element such as a mirror or a prism to turn the laser light towards the scene and a diffuser or diffractive optical element (DOE) to achieve a textured pattern with spatially varying levels light intensity.

Although excellent performance has been achieved with the typical edge emitting projector approach, there are some inherent limitations that affect the overall performance, including accuracy and maximum depth, of the depth cameras. First, the pattern contrast is not very high. Second, the maximum output power is limited to a low value due to eye safety requirement for class 1 laser classification. Third, the design of the pattern to maximize performance, such as control of size and location of each feature in the pattern, when using different algorithms and/or camera field of view is complicated, expensive and time consuming. Fourth, the overall power conversion efficiency of the projector is limited due to the optical losses, which also includes the loss of light that is projected outside the camera's FOV (mainly due to the DOE design challenge mentioned above.)

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 6 is a flow diagram of one embodiment of a process for processing information.

DETAILED DESCRIPTION OF THE PRESENT INVENTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
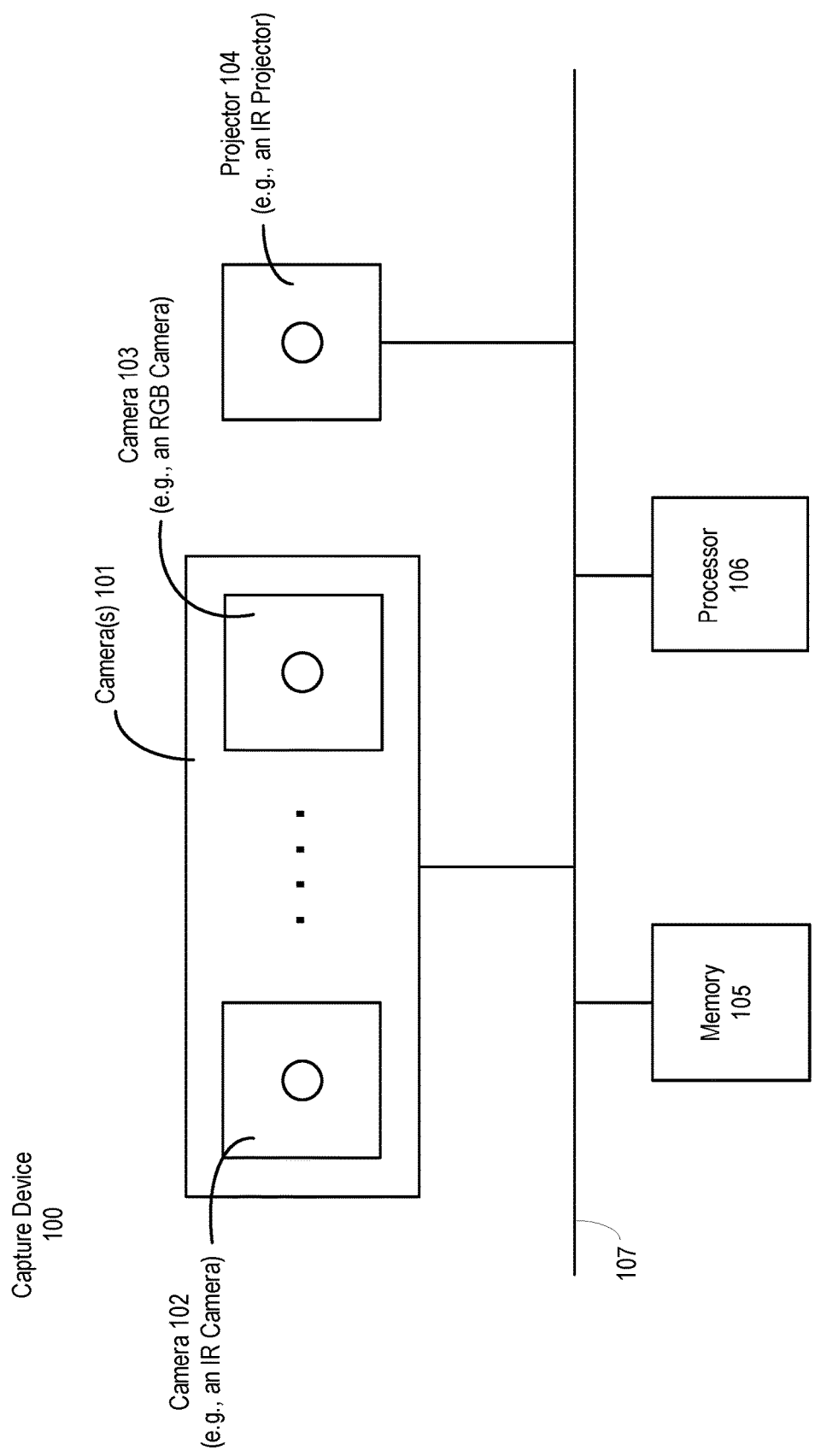
FIG. 1 illustrates one embodiment of an active coded light triangulation system.

FIG. 1 illustrates one embodiment of an active coded light triangulation system. The system includes coded light range cameras operating by projecting a sequence of one-dimensional binary ("black" and "white") patterns onto a scene, such that the produced binary code encodes the angle of the projection plane. Depth is then reconstructed by triangulation consisting of computing the intersection of an imaginary ray emanating from the camera with the plane emanating from the projector.

Referring to FIG. 1, capture device 100 may include a 3D scanner, a 3D camera or any other device configured for a 3D object acquisition. In some embodiments, as illustrated, capture device 100 includes an image capturing device 102 (e.g., a digital camera) and a projector unit 104, such as a laser projector or laser scanner, having a number of components. In some embodiments, digital camera 102 may comprise an infrared (IR) camera, and the projector unit 104 may comprise an IR projector.

Projector unit 104 is configured to project a light pattern as described above and may comprise a one-dimensional code projector. In one embodiment, the light patterns comprise one-dimensional coded light patterns, e.g., the patterns that may be described by one-dimensional or linear codes. The light patterns formed by the laser planes on a surface of the object may be received by image capturing device 102 and sensed (e.g., read) by a sensor of image capturing device 102. Based on the readings of the multiple scans of the light patterns accumulated during a sensing cycle of the sensor, capture device 100 may be configured to reconstruct the shape of the object.

In some embodiments, capture device 100 may further include another image capturing device, such as digital camera 103. In some embodiments, digital camera 103 may have a resolution that is different than that of digital camera 103. For example, digital camera 102 may be a multichromatic camera, such as red, green, and blue (RGB) camera configured to capture texture images of an object.

Capture device 100 may further include a processor 106 that may be in operative communication with the image camera component 101 over a bus or interconnect 107. Processor 106 may include a standardized processor, a specialized processor, a microprocessor, or the like that may execute instructions that may include instructions for generating depth information, generating a depth image, determining whether a suitable target may be included in the depth image, or performing other operations described herein.

Processor 106 may be configured to reconstruct the object based on the images captured by digital camera 102, for example, using geometry techniques or other techniques used for 3D image reconstruction. Processor 106 may be further configured to dynamically calibrate capture device 100 to correct distortions in the reconstructed image of the object that may be caused, for example, by various external factors (e.g., temperature).

Capture device 100 may further include a memory 105 that may store the instructions that may be executed by processor 106, images or frames of images captured by the cameras, user profiles or any other suitable information, images, or the like. According to one example, memory 105 may include random access memory (RAM), read only memory (ROM), cache, Flash memory, a hard disk, or any other suitable storage component. As shown in FIG. 1, memory component 105 may be a separate component in communication with the cameras 101 and processor 106. Alternatively, memory 105 may be integrated into processor 106 and/or the image capture cameras 101. In one embodiment, some or all of the components 102-106 are located in a single housing.

Processor 105, memory 104, other components (not shown), image capturing device 102, and projector unit 104 may be coupled with one or more interfaces (not shown) configured to facilitate information exchange among the above-mentioned components. Communications interface (s) (not shown) may provide an interface for device 100 to communicate over one or more wired or wireless network(s) and/or with any other suitable device. In various embodiments, capture device 100 may be included to or associated with, but is not limited to, a server, a workstation, a desktop computing device, or a mobile computing device (e.g., a laptop computing device, a handheld computing device, a handset, a tablet, a smartphone, a netbook, ultrabook, etc.).

In one embodiment, capture device 100 is integrated into a computer system (e.g., laptop, personal computer (PC), etc.). However, capture device 100 can be alternatively configured as a standalone device that is couplable to such a computer system using conventional technologies including both wired and wireless connections.

In various embodiments, capture device 100 may have more or less components, and/or different architectures. For example, in some embodiments, capture device 100 may include one or more of a camera, a keyboard, display such as a liquid crystal display (LCD) screen (including touch screen displays), a touch screen controller, non-volatile memory port, antenna or multiple antennas, graphics chip, ASIC, speaker(s), a battery, an audio codec, a video codec, a power amplifier, a global positioning system (GPS) device, a compass, an accelerometer, a gyroscope, and the like. In various embodiments, capture device 100 may have more or less components, and/or different architectures. In various embodiments, techniques and configurations described herein may be used in a variety of systems that benefit from the principles described herein.

Capture device 100 may be used for a variety of purposes, including, but not limited to, being part of a target recognition, analysis, and tracking system to recognize human and non-human targets in a capture area of the physical space without the use of special sensing devices attached to the subjects, uniquely identify them, and track them in three-dimensional space. Capture device 100 may be configured to capture video with depth information including a depth image that may include depth values via any suitable technique including, for example, triangulation, time-of-flight, structured light, stereo image, or the like.

Capture device 100 may be configured to operate as a depth camera that may capture a depth image of a scene. The depth image may include a two-dimensional (2D) pixel area of the captured scene where each pixel in the 2D pixel area may represent a depth value such as a distance in, for example, centimeters, millimeters, or the like of an object in the captured scene from the camera. In this example, capture device 100 includes an IR light projector 404, an IR camera 102, and a visible light RGB camera 103 that are configured in an array.

Various techniques may be utilized to capture depth video frames. For example, capture device 100 may use structured light to capture depth information. In such an analysis, patterned light (i.e., light displayed as a known pattern such as a grid pattern or a stripe pattern) may be projected onto the capture area via, for example, IR light projector 104. Upon striking the surface of one or more targets or objects in the capture area, the pattern may become deformed in response. Such a deformation of the pattern may be captured by, for example, the IR camera 102 and/or the RGB camera 103 and may then be analyzed to determine a physical distance from capture device 100 to a particular location on the targets or objects.

Capture device 100 may utilize two or more physically separated cameras that may view a capture area from different angles, to obtain visual stereo data that may be resolved to generate depth information. Other types of depth image arrangements using single or multiple cameras can also be used to create a depth image.

Capture device 100 may provide the depth information and images captured by, for example, IR camera 102 and/or the RGB camera 103, including a skeletal model and/or facial tracking model that may be generated by capture device 100, where the skeletal and/or facial tracking models, depth information, and captured images are used to, for example, create a virtual screen, adapt the user interface, and control an application.

In summary, capture device 100 may comprise a projector unit 104 (e.g., an IR projector), a digital camera (e.g., IR camera) 102, another digital camera (e.g., multi-chromatic camera) 103, and a processor (controller) configured to operate capture device 100 according to the embodiments described herein. However, the above assembly configuration is described for illustration purposes only, and is should not be limiting to the present disclosure. Various configurations of an assembly for a 3D object acquisition may be used to implement the embodiments described herein. For example, an assembly for a 3D object acquisition configured to enable the reconstructed object distortion corrections may include three digital cameras, two of which may be used to reconstruct a 3D image of an object, and the third camera (e.g. with a resolution that is different than those of the two cameras) may be used to capture images of the object in order to identify image distortions in the reconstructed object and to compensate for identified distortions.

IR Projector

As discussed above, a coded light camera comprising an IR projector 104 projects one-dimensional code patterns onto the scene, and an IR camera 102 captures the patterns. Decoding of the captured patterns at every pixel location $x_c$ in the camera produces a code encoding the location $x_p$ of the projected plane. In triangulation, the plane is intersected with the ray emanating from the camera focal point through $x_c$, yielding the distance to the object $z(x_c)$.

In one embodiment, a processing unit receives a sequence of images and reconstructs depth using triangulation in response to camera and projector location coordinates. In one embodiment, the processing unit is operable to generate a depth value based on the new projector location coordinate a camera location coordinate.

Figure 2A:
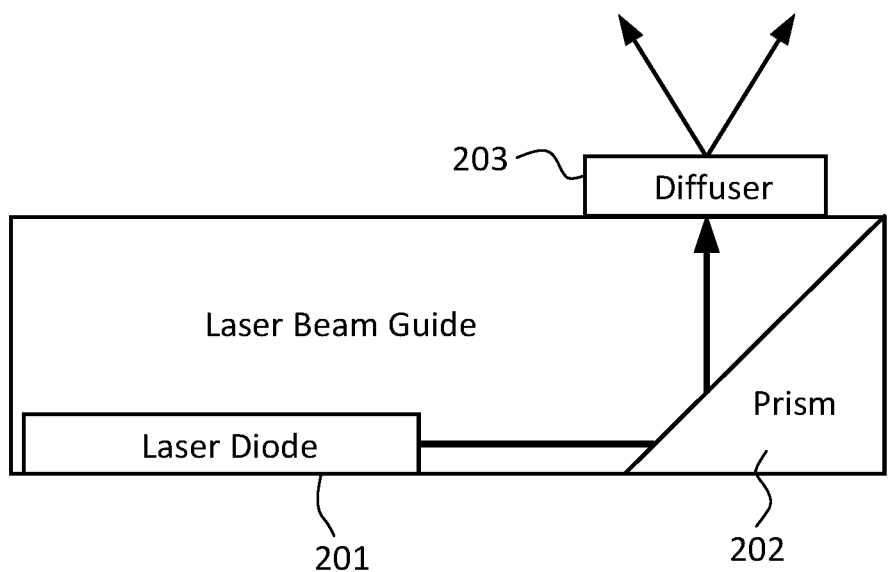
FIG. 2A is a schematic of a typical edge emitting laser projector design along with an example of the projected pattern.
Figure 2B:
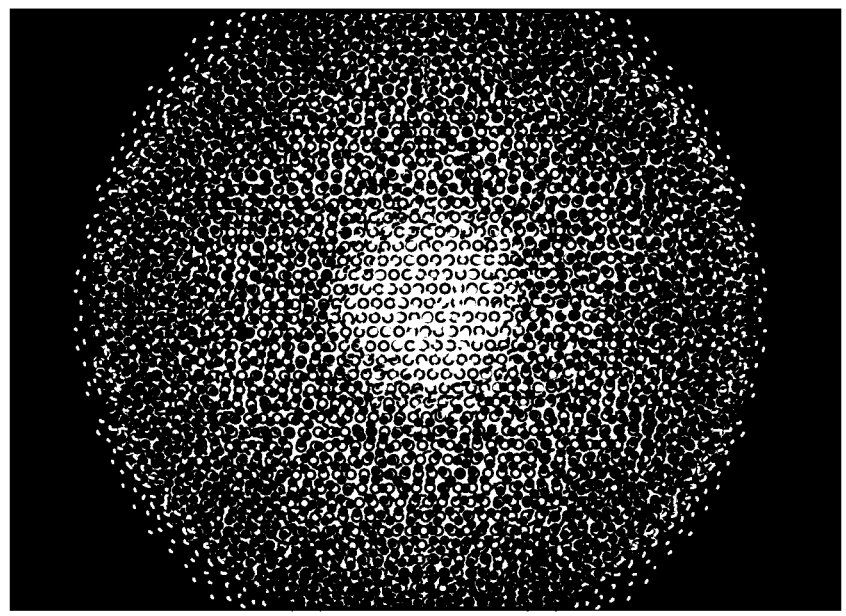
FIG. 2B illustrates an example of a dot pattern.

FIG. 2A is a schematic of a typical edge emitting laser projector design along with an example of the projected pattern. Referring to FIG. 2A, projector 200 an IR edge emitting laser diode 201, an optical element 202 (e.g., a mirror, a prism), to turn the laser light towards the scene and a diffuser or diffractive optical element (DOE) 203 to achieve a textured pattern with spatially varying levels light intensity. FIG. 2B illustrates an example of such a pattern. However, as set forth above, such a projector design has a number of disadvantages.

In one embodiment, the IR projector comprises a vertical cavity surface emitting laser (VCSEL) array based pattern projector. In one embodiment, the VCSEL array based pattern projector has high efficiency, a small form factor and alleviates the issues discussed above with regard to the edge emitting laser projector, thereby resulting in a significant improvement in the performance of stereo-depth cameras. Thus, in the following disclosure, a VCSEL array projector is disclosed that offers features that could significantly improve the range and accuracy of a stereo-depth camera, while maintaining low cost, small size and high power efficiency.

Figure 3A:
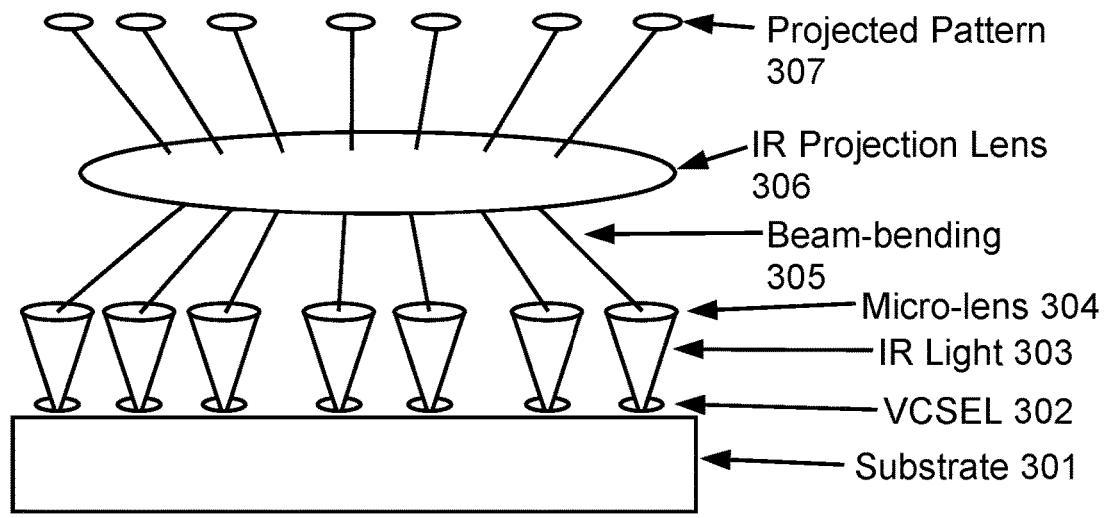
FIG. 3A is a schematic of one embodiment of a VCSEL projector.
Figure 3B:
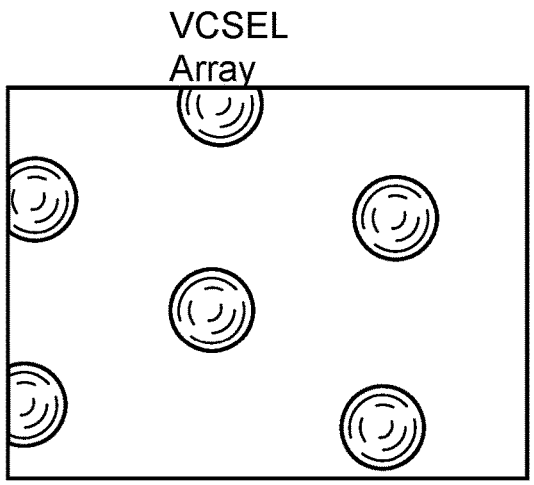
FIG. 3B illustrates a portion of one embodiment of a VCSEL array.
Figure 3C:
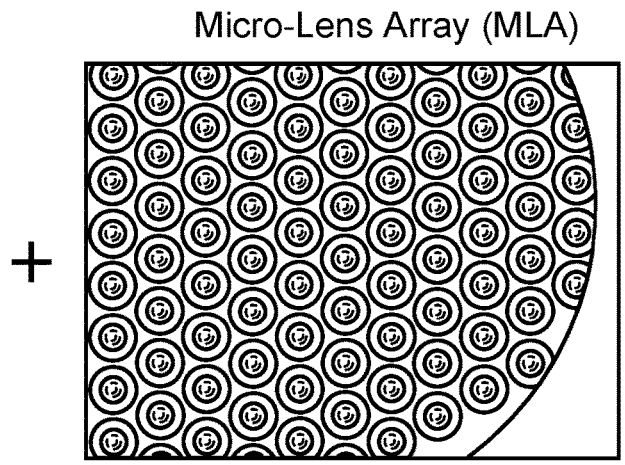
FIG. 3C illustrates a portion of one embodiment of a micro-lens array (MLA).

FIG. 3A is a schematic of one embodiment of a VCSEL projector. Referring to FIG. 3A, a substrate includes a VCSEL array of VCSELs, such as VCSEL 302. FIG. 3B illustrates a portion of one embodiment of a VCSEL array. Each VCSEL produces IR light. For example, VCSEL 302 produces IR light 303. A micro-lens array (MLA) includes multiple lenses with each lens positioned over one VCSEL (and the IR light it produces). For example, micro-lens 304 is positioned over IR light from VCSEL 302. FIG. 3C illustrates a portion of one embodiment of a MLA.

Light from the MLA is projected through IR projection lens 306 to create projected pattern 307 on an object (e.g., wall, surface, etc.). In one embodiment, IR projection lens 306 comprises a single lens. In another embodiment, IR projection lens 306 is constructed with multiple lenses aligned and held in place with respect to each other. In one embodiment, the IR projection lens 306 comprises an imaging lens in a camera.

Figures 4A, 4B:
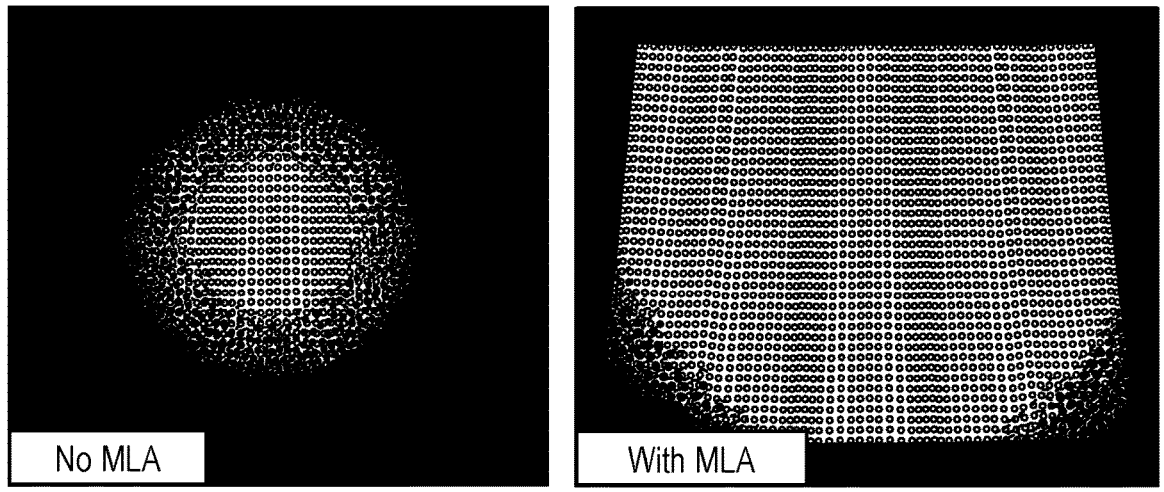
FIG. 4A illustrates an example of a projected pattern from a projector that doesn't use a MLA.
FIG. 4B illustrates an example of a projected pattern (e.g., far field image of the pattern) from a projector that does use a MLA.

Thus, in the case of the proposed VCSEL array based projector, the light emitted by the VCSEL array is imaged or projected onto the scene by the projection lens (which can be the same as the imaging lens used in the camera). FIG. 4A illustrates an example of a projected pattern from a projector that doesn't use a MLA, while FIG. 4B illustrates an example of a projected pattern (e.g., far field image of the pattern) from a projector that does use a MLA.

In one embodiment, each spot in the projected image is an individual laser from the VSCEL array. In one embodiment, the required size and location of each spot/laser is patterned lithographically onto substrate 301 and also controlled by the use of projection lens 306 with required field of view (FOV) to closely match the optimal pattern required to maximize depth performance for a given depth calculation algorithm being used for generating depth information (e.g., triangulation technique).

In one embodiment, the VCSEL projector disclosed herein uses a lithographically patterned micro-lens array (MLA) with varying level of lens offset to tune the bending angle for emitted light from individual VCSELs in the array to match the chief ray angle of the projection lens (larger bending angle at the edges compared to the center) in order to achieve enough spots to fill the entire FOV while significantly reducing the loss of light from the VCSELs at the edges. The result is an IR projector that offers flexibility to optimize depth performance for a wide range of stereo depth imaging systems under varied conditions and applications without compromising size or cost. Note that the use of lithography to create a lens array is well-known in the art.

Figure 5:
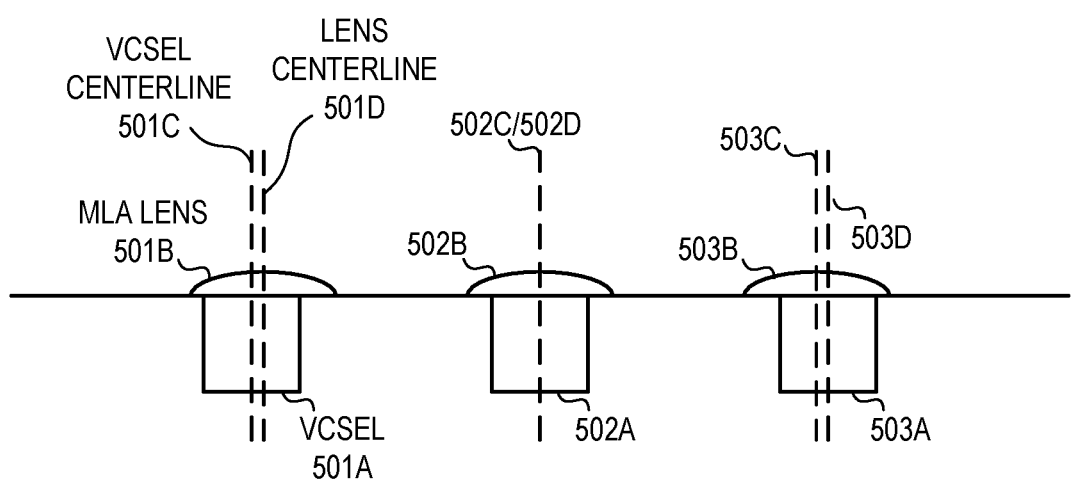
FIG. 5 illustrates examples of lens offset.

FIG. 5 illustrates examples of lens offset. In one embodiment, lenses of the MLA cause light emitted by VCSELs in the VCSEL array to bend so that more light emitted from the VCSELs travels through the projection lens.

Referring to FIG. 5, VCSELs 501A-C of a substrate are shown. Note that only three VCSELs are shown for illustration purposes; one skilled in the art would understand that the substrate includes many more VCSELs. VCSEL 501A and 501C are closer to opposite edges of the FOV than VCSEL 501B, which is in the center. Each of VCSELs 501A-501C includes a micro lens located over a corresponding VCSEL. For example, micro lens 501B is located over VCSEL 501A, micro lens 502B is located over VCSEL 502A, and micro lens 503B is located over VCSEL 503A. In one embodiment, lenses of the MLA farther from a center of the VCSEL array are operable to bend the light more than those closer to the center of the VCSEL array. In one embodiment, lenses of the MLA bend light emitted by the VCSELs in an increasing amount as lenses are closer to an edge of the field of view (FOV). For example, micro lenses 501B and 503B closer to the edge of the VCSEL array bend light more than micro lens 502B, which is closer to the center of the VCSEL array.

In one embodiment, each MLA lens bends light because it is offset from its corresponding VCSEL. In one embodiment, the micro-lenses of the MLA on the substrate are lithographically patterned to be identical in thickness, shape and morphology. More specifically, the centers of each MLA lens and a corresponding VCSEL are misaligned to cause emitted light from the corresponding VCSEL to be bent. When the lens is offset with respect to the center of the VCSEL, the light from the VCSEL interacts with a different part of the lens, with a different curvature resulting in different bending angles. In one embodiment, the centers (centerlines) of a MLA lens and its corresponding VCSEL with more misalignment (more offset) bend light more than a MLA lens and its corresponding VCSEL pairs with their respective centers (centerlines) less misaligned. Referring back to FIG. 5, the center 501C of VCSEL 501A is misaligned with the center 501D of MLA lens 501B, where center 501D is closer to the center of VCSEL array than center 501C of VCSEL 501A. This causes the light emitted from VCSEL 501A to be bend more towards the center of the VCSEL array. The same applies to VCSEL 503A and the offset associated with its corresponding MLA lens 503B on the opposite edge of VCSEL array. In contrast, the center 502C of VCSEL 502A is not misaligned with the center 502D of MLA lens 502B. In this case, the light emitted from VCSEL 502A to not be bent by MLA lens 502B. Thus, by changing where the center of the MLA lens with respect to its corresponding VCSEL, the beam can be bent and help avoid intensity fall off.

Note that in one embodiment the amount of misalignment is dependent on the IR projection lens used and its location with respect to the VCSEL array. A goal of the MLA and the offsets of the individual lens is to increase the amount of light emitted from the VCSEL array that is transmitted through projection lens. Thus, light emitted from VCSELs on the edges of the VCSEL array may have been bent more if the IR projection lens is closer to the VCSEL array in ensure that the increase amount of light travels through the IR projection lens to create the pattern on the object surface. This is beneficial because using the MLA to bend the light enables a pattern projector to be compact, which is critical for some applications.

FIG. 6 is a flow diagram of one embodiment of a process for processing information. Referring to FIG. 6, the process begins by projecting a sequence of light patterns on an object using a projector, wherein the projector comprises a vertical cavity surface emitting laser (VCSEL) array comprising a plurality of VCSELs, a micro-lens array coupled to the VCSEL array and having a plurality of lenses, and each of the plurality of lenses is positioned over a VCSEL in the VCSEL array, and a projection lens coupled to the micro-lens array (MLA), wherein light emitted by the VCSEL array is projected as a sequence of patterns onto an object by the projection lens (processing block 601). In one embodiment, light emitted by VCSELs in the VCSEL array is bent using lenses of the MLA so that more light emitted from the VCSELs travels through the projection lens.

In one embodiment, light emitted by VCSELs in the VCSEL array using lenses of the MLA so that more light emitted from the VCSELs travels through the projection lens. In on embodiment, lenses of the MLA farther from a center of the VCSEL array are operable to bend the light more than those closer to the center of the VCSEL array. In one embodiment, lenses of the MLA bend light emitted by the VCSELs in an increasing amount as lenses are closer to an edge of the field of view.

In one embodiment, the centers of each MLA lens and a corresponding VCSEL are misaligned to cause emitted light from the corresponding VCSEL to be bent. In one embodiment, centers of MLA lens and a corresponding VCSEL pairs with more misalignment bend light more than MLA lens and corresponding VCSEL pairs with less misalignment.

Next, the process captures, using a camera, a sequence of images of the sequence of light patterns (processing block 602) and generates depth information via triangulation using the sequence of images (processing block 603).

One or more embodiments of the VCSEL projector disclosed herein include one or more advantages compared to other IR projectors used for depth imaging. These advantages include the following:
1. Provides a very high contrast between the bright and dark areas in the pattern, which could also be easily controlled by adjusting the focus of the projection lens.
2. Allows for complete control of the size and location of each feature or spot in the projected pattern to closely match the requirements of the depth calculation algorithm for best depth performance.
3. Provides a laser eye safety limit of ~10 to 100× that is higher than the edge emitting laser & DOE projector. This is due to the fact that each laser in the VCSEL array acts as a separate point source that would be image data slightly different location in the retina. A higher safety limit allows for simpler safety circuits and unlocks many interesting applications including improved outdoor performance.
4. Provides excellent temperature stability of the VCSELs, with wavelength drift ~0.07 nm/C is ~5× smaller than edge emitting lasers, thereby allowing great pattern stability for structured light applications.
5. Facilitates ease of manufacturing and assembly (a process similar to that of a camera) and convenience of changing the pattern density and FOV for use in different depth camera systems.
6. Ensures, by use of the imaging lens used by the cameras as the VCSEL projection lens, minimal loss of light outside the FOV and the use of MLA design results in very high overall power conversion efficiency.

Figure 7:
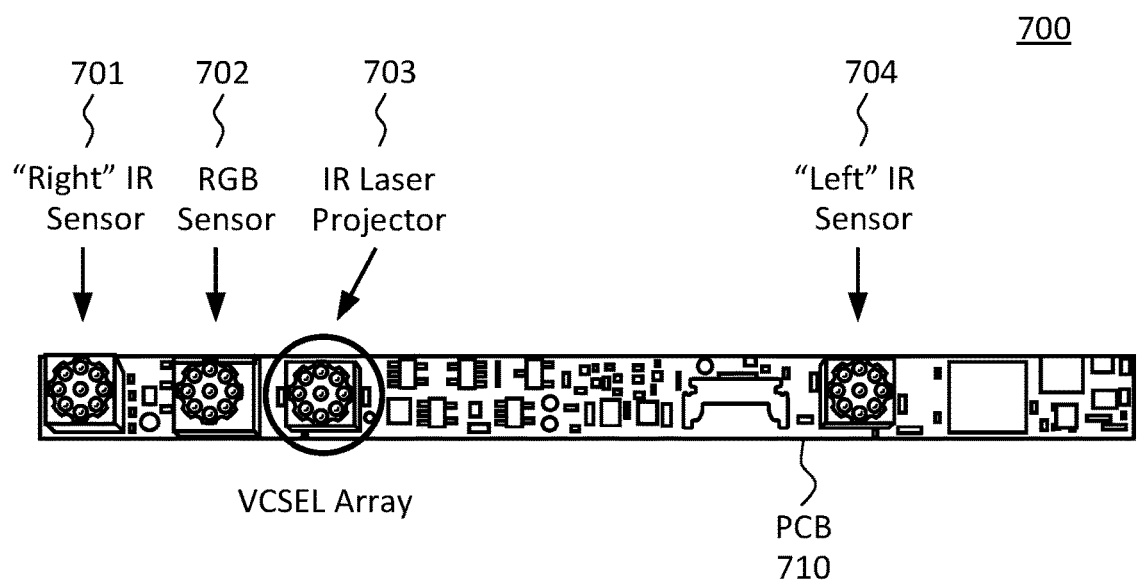
FIG. 7 is a block diagram of one embodiment of a camera system.

FIG. 7 is a block diagram of one embodiment of a camera system. Referring to FIG. 7, camera system 700 comprises a printed circuit board (PCB) 710 with right IR sensor 701 (camera), RGB sensor 702 (camera), IR laser projector 703 with a VCSEL array, and left IR sensor (camera) coupled thereto.

Figure 8:
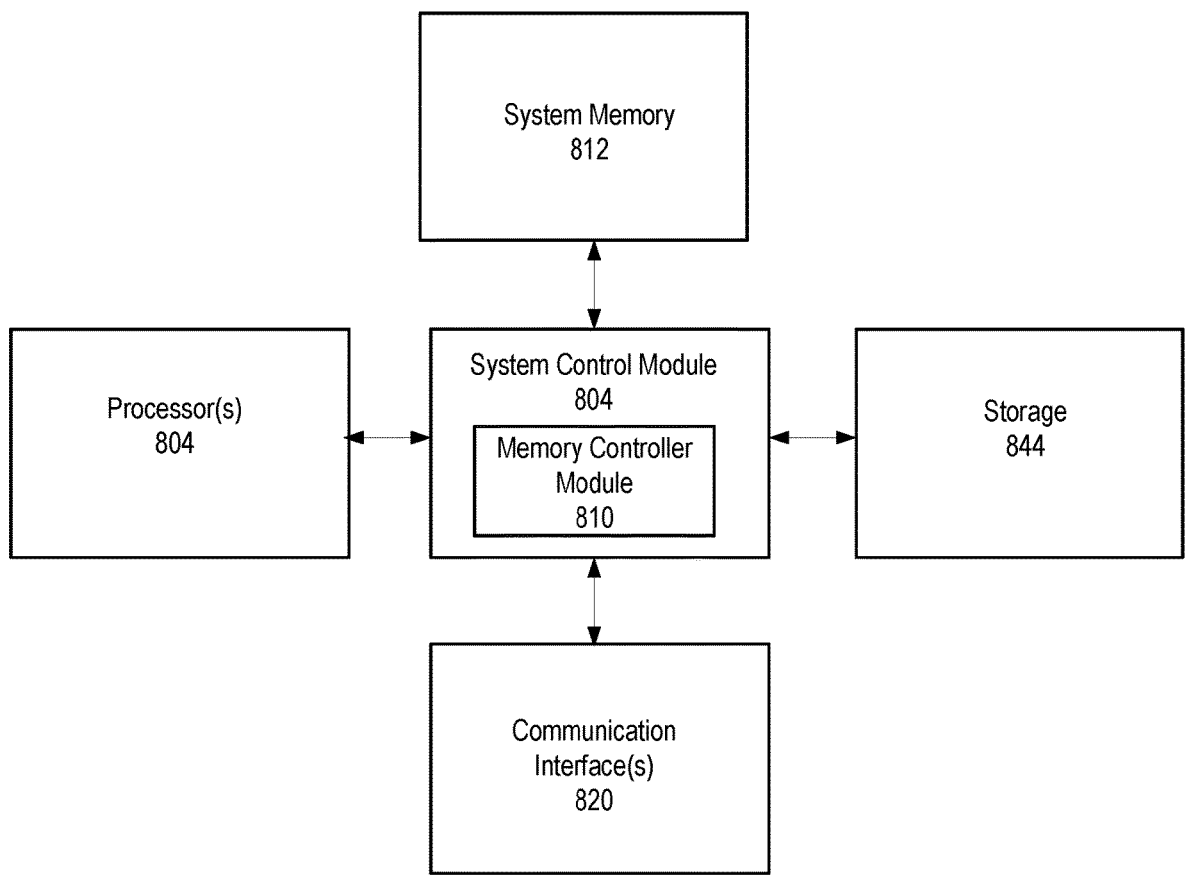
FIG. 8 is a block diagram of one embodiment of a system.

FIG. 8 illustrates, for one embodiment, an example system 800 having one or more processor(s) 804, system control module 808 coupled to at least one of the processor(s) 804, system memory 812 coupled to system control module 808, non-volatile memory (NVM)/storage 814 coupled to system control module 808, and one or more communications interface(s) 820 coupled to system control module 808. In some embodiments, the system 800 may include capture device 100 and provide logic/module that performs functions aimed at compensating for projector distortions in the depth determination in a reconstructed object image described herein.

In some embodiments, the system 800 may include one or more computer-readable media (e.g., system memory or NVM/storage 814) having instructions and one or more processors (e.g., processor(s) 804) coupled with the one or more computer-readable media and configured to execute the instructions to implement a module to perform image distortion correction calculation actions described herein.

System control module 808 for one embodiment may include any suitable interface controllers to provide for any suitable interface to at least one of the processor(s) 804 and/or to any suitable device or component in communication with system control module 808.

System control module 808 may include memory controller module 810 to provide an interface to system memory 812. The memory controller module 810 may be a hardware module, a software module, and/or a firmware module. System memory 812 may be used to load and store data and/or instructions, for example, for system 800. System memory 812 for one embodiment may include any suitable volatile memory, such as suitable DRAM, for example. System control module 808 for one embodiment may include one or more input/output (I/O) controller(s) to provide an interface to NVM/storage 814 and communications interface(s) 820.

The NVM/storage 814 may be used to store data and/or instructions, for example. NVM/storage 814 may include any suitable non-volatile memory, such as flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example. The NVM/storage 814 may include a storage resource physically part of a device on which the system 800 is installed or it may be accessible by, but not necessarily a part of, the device. For example, the NVM/storage 814 may be accessed over a network via the communications interface(s) 820.

Communications interface(s) 820 may provide an interface for system 800 to communicate over one or more network(s) and/or with any other suitable device. The system 800 may wirelessly communicate with the one or more components of the wireless network in accordance with any of one or more wireless network standards and/or protocols.

For one embodiment, at least one of the processor(s) 804 may be packaged together with logic for one or more controller(s) of system control module 808, e.g., memory controller module 810. For one embodiment, at least one of the processor(s) 804 may be packaged together with logic for one or more controllers of system control module 808 to form a System in Package (SiP). For one embodiment, at least one of the processor(s) 804 may be integrated on the same die with logic for one or more controller(s) of system control module 808. For one embodiment, at least one of the processor(s) 804 may be integrated on the same die with logic for one or more controller(s) of system control module 808 to form a System on Chip (SoC).

In various embodiments, the system 800 may have more or less components, and/or different architectures. For example, in some embodiments, the system 800 may include one or more of a camera, a keyboard, liquid crystal display (LCD) screen (including touch screen displays), non-volatile memory port, multiple antennas, graphics chip, application-specific integrated circuit (ASIC), and speakers.

In various implementations, the system 800 may be, but is not limited to, a mobile computing device (e.g., a laptop computing device, a handheld computing device, a tablet, a netbook, etc.), a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 800 may be any other electronic device.

Figure 9:
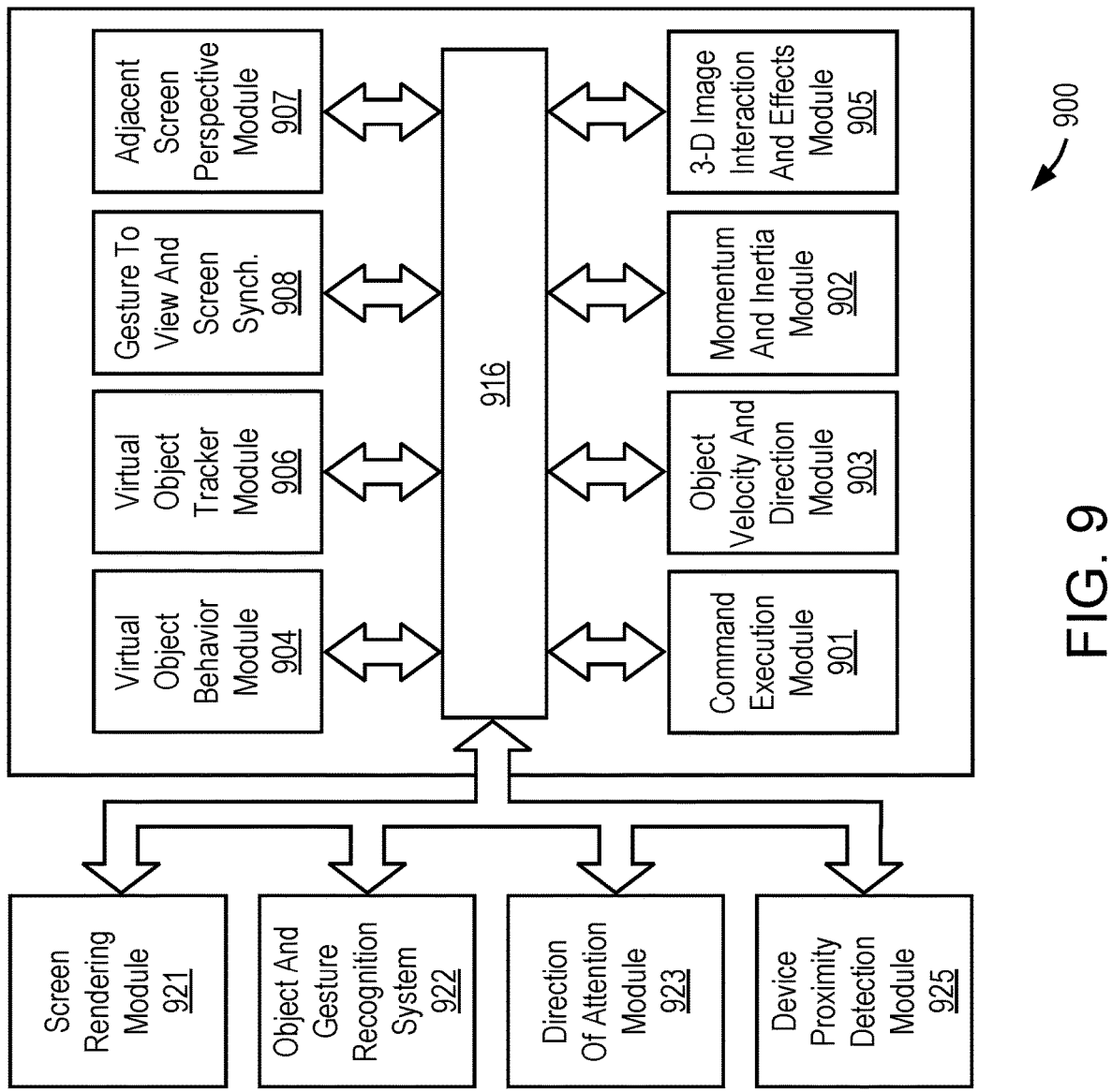
FIG. 9 illustrates an embodiment of a computing environment capable of supporting the operations described herein.

FIG. 9 illustrates an embodiment of a computing environment 900 capable of supporting the operations discussed above. The modules described before can use the depth information (e.g., values) and other data described above to perform these functions. The modules and systems can be implemented in a variety of different hardware architectures and form factors.

Command Execution Module 901 includes a central processing unit to cache and execute commands and to distribute tasks among the other modules and systems shown. It may include an instruction stack, a cache memory to store intermediate and final results, and mass memory to store applications and operating systems. Command Execution Module 901 may also serve as a central coordination and task allocation unit for the system.

Screen Rendering Module 921 draws objects on the one or more multiple screens for the user to see. It can be adapted to receive the data from Virtual Object Behavior Module 904, described below, and to render the virtual object and any other objects and forces on the appropriate screen or screens. Thus, the data from Virtual Object Behavior Module 904 would determine the position and dynamics of the virtual object and associated gestures, forces and objects, for example, and Screen Rendering Module 921 would depict the virtual object and associated objects and environment on a screen, accordingly. Screen Rendering Module 921 could further be adapted to receive data from Adjacent Screen Perspective Module 907, described below, to either depict a target landing area for the virtual object if the virtual object could be moved to the display of the device with which Adjacent Screen Perspective Module 907 is associated. Thus, for example, if the virtual object is being moved from a main screen to an auxiliary screen, Adjacent Screen Perspective Module 907 could send data to the Screen Rendering Module 921 to suggest, for example in shadow form, one or more target landing areas for the virtual object on that track to a user's hand movements or eye movements.

Object and Gesture Recognition System 922 may be adapted to recognize and track hand and harm gestures of a user. Such a module may be used to recognize hands, fingers, finger gestures, hand movements and a location of hands relative to displays. For example, Object and Gesture Recognition System 922 could for example determine that a user made a body part gesture to drop or throw a virtual object onto one or the other of the multiple screens, or that the user made a body part gesture to move the virtual object to a bezel of one or the other of the multiple screens. Object and Gesture Recognition System 922 may be coupled to a camera or camera array, a microphone or microphone array, a touch screen or touch surface, or a pointing device, or some combination of these items, to detect gestures and commands from the user.

The touch screen or touch surface of Object and Gesture Recognition System 922 may include a touch screen sensor. Data from the sensor may be fed to hardware, software, firmware or a combination of the same to map the touch gesture of a user's hand on the screen or surface to a corresponding dynamic behavior of a virtual object. The sensor date may be used to momentum and inertia factors to allow a variety of momentum behavior for a virtual object based on input from the user's hand, such as a swipe rate of a user's finger relative to the screen. Pinching gestures may be interpreted as a command to lift a virtual object from the display screen, or to begin generating a virtual binding associated with the virtual object or to zoom in or out on a display. Similar commands may be generated by Object and Gesture Recognition System 922, using one or more cameras, without the benefit of a touch surface.

Direction of Attention Module 923 may be equipped with cameras or other sensors to track the position or orientation of a user's face or hands. When a gesture or voice command is issued, the system can determine the appropriate screen for the gesture. In one example, a camera is mounted near each display to detect whether the user is facing that display. If so, then the direction of attention module information is provided to Object and Gesture Recognition Module 922 to ensure that the gestures or commands are associated with the appropriate library for the active display. Similarly, if the user is looking away from all of the screens, then commands can be ignored.

Device Proximity Detection Module 925 can use proximity sensors, compasses, GPS (global positioning system) receivers, personal area network radios, and other types of sensors, together with triangulation and other techniques to determine the proximity of other devices. Once a nearby device is detected, it can be registered to the system and its type can be determined as an input device or a display device or both. For an input device, received data may then be applied to Object Gesture and Recognition System 922. For a display device, it may be considered by Adjacent Screen Perspective Module 907.

Virtual Object Behavior Module 904 is adapted to receive input from Object Velocity and Direction Module 903, and to apply such input to a virtual object being shown in the display. Thus, for example, Object and Gesture Recognition System 922 would interpret a user gesture and by mapping the captured movements of a user's hand to recognized movements, Virtual Object Tracker Module 906 would associate the virtual object's position and movements to the movements as recognized by Object and Gesture Recognition System 922, Object and Velocity and Direction Module 903 would capture the dynamics of the virtual object's movements, and Virtual Object Behavior Module 904 would receive the input from Object and Velocity and Direction Module 903 to generate data that would direct the movements of the virtual object to correspond to the input from Object and Velocity and Direction Module 903.

Virtual Object Tracker Module 906 on the other hand may be adapted to track where a virtual object should be located in three-dimensional space in a vicinity of a display, and which body part of the user is holding the virtual object, based on input from Object Gesture and Recognition System 922. Virtual Object Tracker Module 906 may for example track a virtual object as it moves across and between screens and track which body part of the user is holding that virtual object. Tracking the body part that is holding the virtual object allows a continuous awareness of the body part's air movements, and thus an eventual awareness as to whether the virtual object has been released onto one or more screens.

Gesture to View and Screen Synchronization Module 908, receives the selection of the view and screen or both from Direction of Attention Module 923 and, in some cases, voice commands to determine which view is the active view and which screen is the active screen. It then causes the relevant gesture library to be loaded for Object and Gesture Recognition System 922. Various views of an application on one or more screens can be associated with alternative gesture libraries or a set of gesture templates for a given view.

Adjacent Screen Perspective Module 907, which may include or be coupled to Device Proximity Detection Module 925, may be adapted to determine an angle and position of one display relative to another display. A projected display includes, for example, an image projected onto a wall or screen. The ability to detect a proximity of a nearby screen and a corresponding angle or orientation of a display projected therefrom may for example be accomplished with either an infrared emitter and receiver, or electromagnetic or photo-detection sensing capability. For technologies that allow projected displays with touch input, the incoming video can be analyzed to determine the position of a projected display and to correct for the distortion caused by displaying at an angle. An accelerometer, magnetometer, compass, or camera can be used to determine the angle at which a device is being held while infrared emitters and cameras could allow the orientation of the screen device to be determined in relation to the sensors on an adjacent device. Adjacent Screen Perspective Module 907 may, in this way, determine coordinates of an adjacent screen relative to its own screen coordinates. Thus, the Adjacent Screen Perspective Module may determine which devices are in proximity to each other, and further potential targets for moving one or more virtual object's across screens. Adjacent Screen Perspective Module 907 may further allow the position of the screens to be correlated to a model of three-dimensional space representing all of the existing objects and virtual objects.

Object and Velocity and Direction Module 903 may be adapted to estimate the dynamics of a virtual object being moved, such as its trajectory, velocity (whether linear or angular), momentum (whether linear or angular), etc. by receiving input from Virtual Object Tracker Module 906. The Object and Velocity and Direction Module 903 may further be adapted to estimate dynamics of any physics forces, by for example estimating the acceleration, deflection, degree of stretching of a virtual binding, etc. and the dynamic behavior of a virtual object once released by a user's body part. Object and Velocity and Direction Module 903 may also use image motion, size and angle changes to estimate the velocity of objects, such as the velocity of hands and fingers Momentum and Inertia Module 902 can use image motion, image size, and angle changes of objects in the image plane or in a three-dimensional space to estimate the velocity and direction of objects in the space or on a display. Momentum and Inertia Module 902 is coupled to Object and Gesture Recognition System 922 to estimate the velocity of gestures performed by hands, fingers, and other body parts and then to apply those estimates to determine momentum and velocities to virtual objects that are to be affected by the gesture.

3D Image Interaction and Effects Module 905 tracks user interaction with 3D images that appear to extend out of one or more screens. The influence of objects in the z-axis (towards and away from the plane of the screen) can be calculated together with the relative influence of these objects upon each other. For example, an object thrown by a user gesture can be influenced by 3D objects in the foreground before the virtual object arrives at the plane of the screen. These objects may change the direction or velocity of the projectile or destroy it entirely. The object can be rendered by the 3D Image Interaction and Effects Module 905 in the foreground on one or more of the displays.

In a first example embodiment, an apparatus comprises a vertical cavity surface emitting laser (VCSEL) array comprising a plurality of VCSELs, a micro-lens array coupled to the VCSEL array and having a plurality of lenses, and each of the plurality of lenses is positioned over a VCSEL in the VCSEL array, and a projection lens coupled to the micro-lens array (MLA), wherein light emitted by the VCSEL array is projected as a sequence of patterns onto an object by the projection lens.

In another example embodiment, the subject matter of the first example embodiment can optionally include that lenses of the MLA cause light emitted by VCSELs in the VCSEL array to bend so that more light emitted from the VCSELs travels through the projection lens. In another example embodiment, the subject matter of this example embodiment can optionally include that lenses of the MLA farther from a center of the VCSEL array are operable to bend the light more than those closer to the center of the VCSEL array. In another example embodiment, the subject matter of the first example embodiment can optionally include that as lenses of the MLA bend light emitted by the VCSELs in an increasing amount as lenses are closer to an edge of the field of view.

In another example embodiment, the subject matter of the first example embodiment can optionally include that the centers of each MLA lens and a corresponding VCSEL are misaligned to cause emitted light from the corresponding VCSEL to be bent. In another example embodiment, the subject matter of the first example embodiment can optionally include that centers of MLA lens and a corresponding VCSEL pairs with more misalignment bend light more than MLA lens and corresponding VCSEL pairs with less misalignment.

In another example embodiment, the subject matter of the first example embodiment can optionally include that the light comprises infra-red (IR) light and the projection lens comprises an IR projection lens.

In a second example embodiment, an apparatus comprises: a projector configured to project a sequence of light patterns on an object, where the projector comprises a vertical cavity surface emitting laser (VCSEL) array comprising a plurality of VCSELs, a micro-lens array coupled to the VCSEL array and having a plurality of lenses, and each of the plurality of lenses is positioned over a VCSEL in the VCSEL array, a projection lens coupled to the micro-lens array (MLA), wherein light emitted by the VCSEL array is projected as a sequence of patterns onto an object by the projection lens; and a first camera configured to capture a sequence of images of the object illuminated with the projected light patterns; and a processing unit to receive the sequence of images and reconstruct depth using triangulation.

In another example embodiment, the subject matter of the second example embodiment can optionally include that lenses of the MLA cause light emitted by VCSELs in the VCSEL array to bend so that more light emitted from the VCSELs travels through the projection lens. In another example embodiment, the subject matter of this example embodiment can optionally include that lenses of the MLA farther from a center of the VCSEL array are operable to bend the light more than those closer to the center of the VCSEL array. In another example embodiment, the subject matter of this example embodiment can optionally include that lenses of the MLA bend light emitted by the VCSELs in an increasing amount as lenses are closer to an edge of the field of view.

In another example embodiment, the subject matter of the second example embodiment can optionally include that the centers of each MLA lens and a corresponding VCSEL are misaligned to cause emitted light from the corresponding VCSEL to be bent. In another example embodiment, the subject matter of this example embodiment can optionally include that centers of MLA lens and a corresponding VCSEL pairs with more misalignment bend light more than MLA lens and corresponding VCSEL pairs with less misalignment.

In another example embodiment, the subject matter of the second example embodiment can optionally include that the projector comprises an infra-red (IR) projector and the projection lens comprises an IR projection lens.

In another example embodiment, the subject matter of the second example embodiment can optionally include a second camera configured to capture a second image of the object illuminated with the projected light patterns and configured to capture a texture image of the object in the second image. In another example embodiment, the subject matter of this example embodiment can optionally include that the projector comprises an infrared (IR) projector, the first camera comprises an IR camera, and the second camera comprises a red, green, and blue (RGB) camera.

In a third example embodiment, a method comprises: projecting a sequence of light patterns on an object using a projector, wherein the projector comprises a vertical cavity surface emitting laser (VCSEL) array comprising a plurality of VCSELs, a micro-lens array coupled to the VCSEL array and having a plurality of lenses, and each of the plurality of lenses is positioned over a VCSEL in the VCSEL array, and a projection lens coupled to the micro-lens array (MLA), wherein light emitted by the VCSEL array is projected as a sequence of patterns onto an object by the projection lens; and capturing, using a camera, a sequence of images of the sequence of light patterns; and generating depth information via triangulation using the sequence of images.

In another example embodiment, the subject matter of the third example embodiment can optionally include bending light emitted by VCSELs in the VCSEL array using lenses of the MLA so that more light emitted from the VCSELs travels through the projection lens. In another example embodiment, the subject matter of this example embodiment can optionally include that lenses of the MLA farther from a center of the VCSEL array are operable to bend the light more than those closer to the center of the VCSEL array. In another example embodiment, the subject matter of this example embodiment can optionally include that lenses of the MLA bend light emitted by the VCSELs in an increasing amount as lenses are closer to an edge of the field of view.

In another example embodiment, the subject matter of the third example embodiment can optionally include that the centers of each MLA lens and a corresponding VCSEL are misaligned to cause emitted light from the corresponding VCSEL to be bent. In another example embodiment, the subject matter of the third example embodiment can optionally include that centers of MLA lens and a corresponding VCSEL pairs with more misalignment bend light more than MLA lens and corresponding VCSEL pairs with less misalignment.

In another example embodiment, the subject matter of the third example embodiment can optionally include that the light comprises infra-red (IR) light and the projection lens comprises an IR projection lens.

In a fourth example embodiment, an article of manufacture has one or more non-transitory computer readable storage media storing instructions which when executed by a system to perform a method comprising: receiving a sequence of images of the sequence of light patterns captured by a camera, wherein the light patterns are projected by a projector that comprises a vertical cavity surface emitting laser (VCSEL) array comprising a plurality of VCSELs, a micro-lens array coupled to the VCSEL array and having a plurality of lenses, and each of the plurality of lenses is positioned over a VCSEL in the VCSEL array, and a projection lens coupled to the micro-lens array (MLA), wherein light emitted by the VCSEL array is projected as a sequence of patterns onto an object by the projection lens; and generating depth information via triangulation using the sequence of images.

In another example embodiment, the subject matter of the fourth example embodiment can optionally include that the method further comprises further comprising bending light emitted by VCSELs in the VCSEL array using lenses of the MLA so that more light emitted from the VCSELs travels through the projection lens.

In another example embodiment, the subject matter of the fourth example embodiment can optionally include that lenses of the MLA farther from a center of the VCSEL array are operable to bend the light more than those closer to the center of the VCSEL array.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An apparatus comprising:
an array of vertical cavity surface emitting lasers (VCSELs) distributed across a planar surface of a substrate;
an array of micro-lenses coupled to the array of VCSELs, the array of micro-lenses in contact with the planar surface of the substrate, ones of the micro-lenses corresponding to respective ones of the VCSELs, centerlines of different ones of the micro-lenses offset relative to centerlines of the respective ones of the VCSELs by different amounts, the different amounts based on distances of the different ones of the micro-lenses from a center of the array of micro-lenses; and
a projection lens coupled to the array of micro-lenses.

2. The apparatus of claim 1, wherein first ones of micro-lenses are closer to the center of the array of micro-lenses than second ones of micro-lenses are to the center of the array of micro-lenses, the amounts of offset of the first ones of the micro-lenses being smaller than the amounts of offset of the second ones of the micro-lenses.

3. The apparatus of claim 1, wherein light emitted by the VCSELs is to be projected as a pattern onto an object by the projection lens.

4. The apparatus of claim 3, wherein the micro-lenses are to cause the light to bend to increase an amount of the light emitted by the VCSELs that travels through the projection lens.

5. The apparatus of claim 4, wherein a first micro-lens in the array of micro-lenses is to bend the light more than a second micro-lens in the array of micro-lenses, the first micro-lens farther from the center of the array of micro-lenses than the second micro-lens is from the center of the array of micro-lenses.

6. The apparatus of claim 3, further including a camera to capture an image of the object illuminated with the light projected by the projection lens.

7. The apparatus of claim 6, further including at least one processor to determine depth information associated with the object based on the image.

8. The apparatus of claim 6, wherein the camera is a first camera and the image is a first image, the apparatus further including a second camera to capture a second image of the object, the second image including a texture of the object.

9. An apparatus comprising:
a plurality of means for emitting light;

a plurality of means for bending the light emitted by the emitting means, different ones of the plurality of bending means to bend the light from respective ones of the plurality of emitting means by different angles; and means for projecting the light emitted by the emitting means onto an object, the different angles by which the different ones of the plurality of bending means bend the light based on different amounts of offset between centerlines of the different ones of the plurality of bending means and centerlines of the respective ones of the plurality of emitting means, the different amounts of offset based on distances of the respective ones of the plurality of emitting means relative to a center of an area across which the plurality of emitting means are distributed.

10. The apparatus of claim 9, wherein centerlines of ones of the plurality of bending means are offset relative to centerlines of respective ones of the plurality of emitting means, a first centerline of a first bending means is offset by a first extent relative to a respective first emitting means, and a second centerline of a second bending means is offset by a second extent relative to a respective second emitting means, the first extent being different than the second extent.

11. The apparatus of claim 10, wherein the first bending means is closer to the center of the area than the second bending means is to the center of the area, the first extent being smaller than the second extent.

12. The apparatus of claim 9, wherein the bending of the light by the bending means is to increase an amount of the light emitted by the emitting means that travels through the projecting means.

13. The apparatus of claim 9, wherein a first bending means is to bend the light more than a second bending means, the first bending means farther from the center of the area than the second bending means is from the center of the area.

14. The apparatus of claim 9, further including means for capturing an image of the object illuminated with the light.

15. The apparatus of claim 14, further including means for processing the image to determine depth information associated with the object.

16. The apparatus of claim 14, wherein the capturing means is a first capturing means and the image is a first image, the apparatus further including a second capturing means to capture a second image of the object, the second image including a texture of the object.

17. At least one computer-readable storage device comprising instructions that, when executed, cause a machine to at least:

project a pattern of light on an object using a projector, the projector including:
vertical cavity surface emitting lasers (VCSELs) to emit the light in a direction away from a surface of a substrate, the substrate supporting the VCSELs along the surface;
micro-lenses fixed to the surface of the substrate, centerlines of different ones of the micro-lenses offset relative to centerlines of respective ones of the VCSELs by different amounts to bend the light emitted from the respective ones of the VCSELs by different angles, the different amounts based on distances of the different ones of the micro-lenses from a center of an area on the surface across which the micro-lenses are distributed; and
a projection lens coupled to the micro-lenses;
capture an image of the object illuminated by the pattern of light; and
generate depth information based on the image.

18. The at least one computer-readable storage device of claim 17, wherein the image is a first image, the instructions to cause the machine to capture a second image of the object, the second image including a texture of the object.

19. A method comprising:
projecting a pattern of light on an object using a projector, the projector including:
an array of vertical cavity surface emitting lasers (VCSELs) to emit the light;
an array of micro-lenses coupled to the array of VCSELs, centerlines of different ones of the micro-lenses offset relative to centerlines of respective ones of the VCSELs by different amounts, the different amounts based on distances of the different ones of the micro-lenses from a center of the array of micro-lenses; and
a projection lens coupled to the array of micro-lenses;
capturing, with a camera, an image of the object illuminated by the pattern of light; and
generating, with at least one processor, depth information based on the image.

20. The method of claim 19, wherein the camera is a first camera and the image is a first image, the method further including capturing a second image of the object, the second image including a texture of the object.

21. The apparatus of claim 6, wherein the projection lens is an imaging lens for the camera.

* * * * *